US 8,893,516 B2

(12) United States Patent
Tsuda

(10) Patent No.: US 8,893,516 B2
(45) Date of Patent: Nov. 25, 2014

(54) MAGNETIC RESONANCE IMAGING DEVICE AND METHOD OF REPLACING A CRYO-COOLER THEREIN

(75) Inventor: Munetaka Tsuda, Ibaraki (JP)

(73) Assignee: Hitachi Medical Corporation, Tokyo (JP)

( * ) Notice: Subject to any disclaimer, the term of this patent is extended or adjusted under 35 U.S.C. 154(b) by 1691 days.

(21) Appl. No.: 11/630,220

(22) PCT Filed: Jun. 29, 2005

(86) PCT No.: PCT/JP2005/011952
§ 371 (c)(1),
(2), (4) Date: Dec. 19, 2006

(87) PCT Pub. No.: WO2006/003937
PCT Pub. Date: Jan. 12, 2006

(65) Prior Publication Data
US 2007/0204630 A1   Sep. 6, 2007

(30) Foreign Application Priority Data
Jul. 2, 2004  (JE) ................................. 2004-196385

(51) Int. Cl.
*F25B 19/00* (2006.01)
*G01R 33/3815* (2006.01)
(52) U.S. Cl.
CPC .................................. *G01R 33/3815* (2013.01)
USPC ........................................................... 62/51.1
(58) Field of Classification Search
USPC ......................................... 62/48.2, 48.3, 51.1
See application file for complete search history.

(56) References Cited

U.S. PATENT DOCUMENTS

| 4,986,077 A | | 1/1991 | Saho et al. |
| 5,063,749 A | * | 11/1991 | Manz ............................... 62/149 |
| 5,150,578 A | * | 9/1992 | Oota et al. ..................... 62/47.1 |
| 5,176,003 A | | 1/1993 | Horikawa et al. |
| 5,225,169 A | * | 7/1993 | Elvin et al. ..................... 422/146 |

(Continued)

FOREIGN PATENT DOCUMENTS

| EP | 0713071 A1 | * 5/1996 | ............. F28D 20/00 |
| JP | 62-258977 | 11/1987 | |

(Continued)

OTHER PUBLICATIONS

Sep. 27, 2011 Japanese official action in connection with a counterpart Japanese patent application.

(Continued)

*Primary Examiner* — Marc Norman
(74) *Attorney, Agent, or Firm* — Cooper & Dunham LLP

(57) ABSTRACT

A magnetic resonance imaging apparatus comprising a vacuum container vacuumized inside thereof, a liquid refrigerant container installed in the vacuum container to store liquid refrigerant therein, a superconducting member installed inside the liquid refrigerant container to be rendered superconductive by being impregnated in the liquid refrigerant and allow current to flow therethrough, and a cryo-cooler connected to an insertion port provided in the liquid refrigerant container to re-condense gas evaporated from the liquid refrigerant in the liquid refrigerant container. The pressure in the liquid refrigerant container is caused to be raised to prevent air from flowing into the insertion port of the liquid refrigerant container from the outside of the vacuum container, and the cryo-cooler is replaced while the pressure in the liquid refrigerant container is greater than that of the outside.

7 Claims, 5 Drawing Sheets

(56) References Cited

U.S. PATENT DOCUMENTS

| | | | |
|---|---|---|---|
| 5,513,498 A * | 5/1996 | Ackermann et al. | 62/51.1 |
| 5,613,367 A | 3/1997 | Chen | |
| 5,782,095 A | 7/1998 | Chen | |
| 6,314,750 B1 * | 11/2001 | Ishikawa et al. | 62/324.1 |
| 6,748,749 B2 | 6/2004 | Tsuda | |
| 2002/0130662 A1 * | 9/2002 | Munetaka | 324/318 |
| 2003/0052681 A1 | 3/2003 | Kono | |

FOREIGN PATENT DOCUMENTS

| | | |
|---|---|---|
| JP | 4-158841 | 6/1992 |
| JP | 4-278145 | 10/1992 |
| JP | 11-243007 | 9/1999 |
| JP | 11-317307 | 11/1999 |
| JP | 2001-143922 | 5/2001 |
| JP | 2001-238864 | 9/2001 |
| JP | 2002-270913 | 9/2002 |
| JP | 2002-336216 | 11/2002 |
| JP | 2003-79596 | 3/2003 |

OTHER PUBLICATIONS

Jun. 27, 2011 Japanese official action in connection with a counterpart Japanese patent application.

Sep. 10, 2012 European search report in connection with corresponding European patent application No. 05 75 5706.

* cited by examiner

MAGNETIC RESONANCE IMAGING DEVICE AND METHOD OF REPLACING A CRYO-COOLER THEREIN

TECHNICAL FIELD

The present invention relates to a magnetic resonance imaging apparatus and maintenance method therefor, especially to a magnetic resonance imaging apparatus and maintenance method therefor capable of replacing a cryo-cooler effectively.

BACKGROUND ART

A magnetic resonance imaging apparatus (hereinafter referred to as MRI apparatus) is for obtaining magnetic resonance images (hereinafter referred to as MR images) that represent the physical properties of an object to be examined by applying magnetic nuclear resonance phenomenon being generated in atomic nuclei of atomic elements which structure the body of the object upon irradiating electromagnetic waves to the object being placed in homogeneous static magnetic field and detecting nuclear magnetic resonance signals (hereinafter referred to as NMR signals) from the object.

Consequently, an MRI apparatus is provided with a static magnetic field generating source for generating static magnetic field in imaging space in an imaging space for arraying the spin direction of hydrogen nucleus (proton) of the object in a predetermined direction. As for the static magnetic field source to be utilized for MRI apparatuses, the ones using superconducting magnets other than permanent magnets are widely commercialized. A general example of a superconducting magnet would be one that generates a static magnetic field by comprising a liquid helium container filled with liquid helium in the vacuum container vacuumized inside thereof, further arranging a superconducting coil therein, and electrifying the superconducting coil which is rendered superconductive state. Such a superconducting magnet is referred to as a liquid helium-cooled superconducting magnet.

There is a technique in relation to a liquid helium-cooled superconducting magnet for re-condensing the vaporized helium gas using a cryo-cooler (freezing machine) for the purpose of compensating the evaporation of liquid helium due to minute inflow of heat into the liquid helium container (for example, Patent Document 1).

Patent Document 1: JP-A-2001-238864.

After examining the above-mentioned conventional technique, the inventors of the present invention have found some problems described below.

In the MRI apparatus according to Patent Document 1 using a cryo-cooler to re-condense the evaporated helium gas, there are cases in which the cryo-cooler is detached for the purpose of maintenance. In such cases, problems are caused when air flows into an insertion port of the cryo-cooler, by constituents in the air being solidified in the vicinity of the insertion port of the helium container and blocking the insertion port. In concrete terms, for example, by constituents of the air being solidified in the closest side to the helium container of a pipe for inserting the cryo-cooler being connected to the liquid helium container, there are times that the cryo-cooler is blocked off from the inside of the helium container when it is reattached. In this case, the vaporized helium gas cannot reach the cryo-cooler, and a problem is caused that the gas cannot be easily re-condensed.

There are some conventional methods such as spraying helium gas of normal temperature onto the insertion port of the cryo-cooler or inserting a heater and dissolving the solidified air. However, using these methods by spraying helium gas of normal temperature to the insertion port of the cryo-cooler or putting in a heater creates additional problem of an increase in temperature of the liquid helium container which increases the possibility for quenching the superconducting coil therein.

BRIEF SUMMARY

In an aspect of this disclosure, there is provided an MRI apparatus capable of facilitating the effective exchange of a cryo-cooler by preventing air from flowing into the helium container at the time of exchanging the cryo-cooler.

In another aspect of this disclosure, an MRI apparatus comprises:

a vacuum container vacuumized inside thereof;

a liquid refrigerant container installed in the vacuum container to store a liquid refrigerant therein;

a superconducting member installed inside the liquid refrigerant container to be rendered superconductive by being impregnated in the liquid refrigerant and allow current to flow therethrough; and freezing means connected to an insertion port provided in the liquid refrigerant container to re-condense gas vaporized from the liquid refrigerant container, characterized in that air flow-in preventing means is provided that raises pressure in the liquid refrigerant container to prevent air from flowing into the insertion port of the liquid refrigerant container from the outside of the vacuum container.

With such configuration it is possible to provide an MRI apparatus that can exchange cryo-coolers effectively by preventing from air from flowing in at the time of exchanging the freezing means.

In an aspect of this disclosure, there is provided a maintenance method of the MRI apparatus, that comprises:

a vacuum container for vacuumizing the inside thereof;

a liquid refrigerant container installed inside of the vacuum container to store a liquid refrigerant therein;

a superconducting member installed inside the liquid refrigerant container to be rendered superconductive by being impregnated in the liquid refrigerant and allow current to flow there-through; and freezing means connected to an aperture provided in the refrigerant container to re-condense gas evaporated from the liquid refrigerant in the liquid refrigerant container, wherein the maintenance method of the MRI apparatus exchanges the freezing means as preventing air from flowing into the liquid refrigerant container via the aperture from the outside of the vacuum container by raising pressure inside of the liquid refrigerant container.

Accordingly, the aforementioned maintenance method can make it possible to exchange cryo-coolers effectively by preventing air to flow in at the time of exchanging freezing means.

BEST MODE FOR CARRYING OUT THE INVENTION

Figure 1:
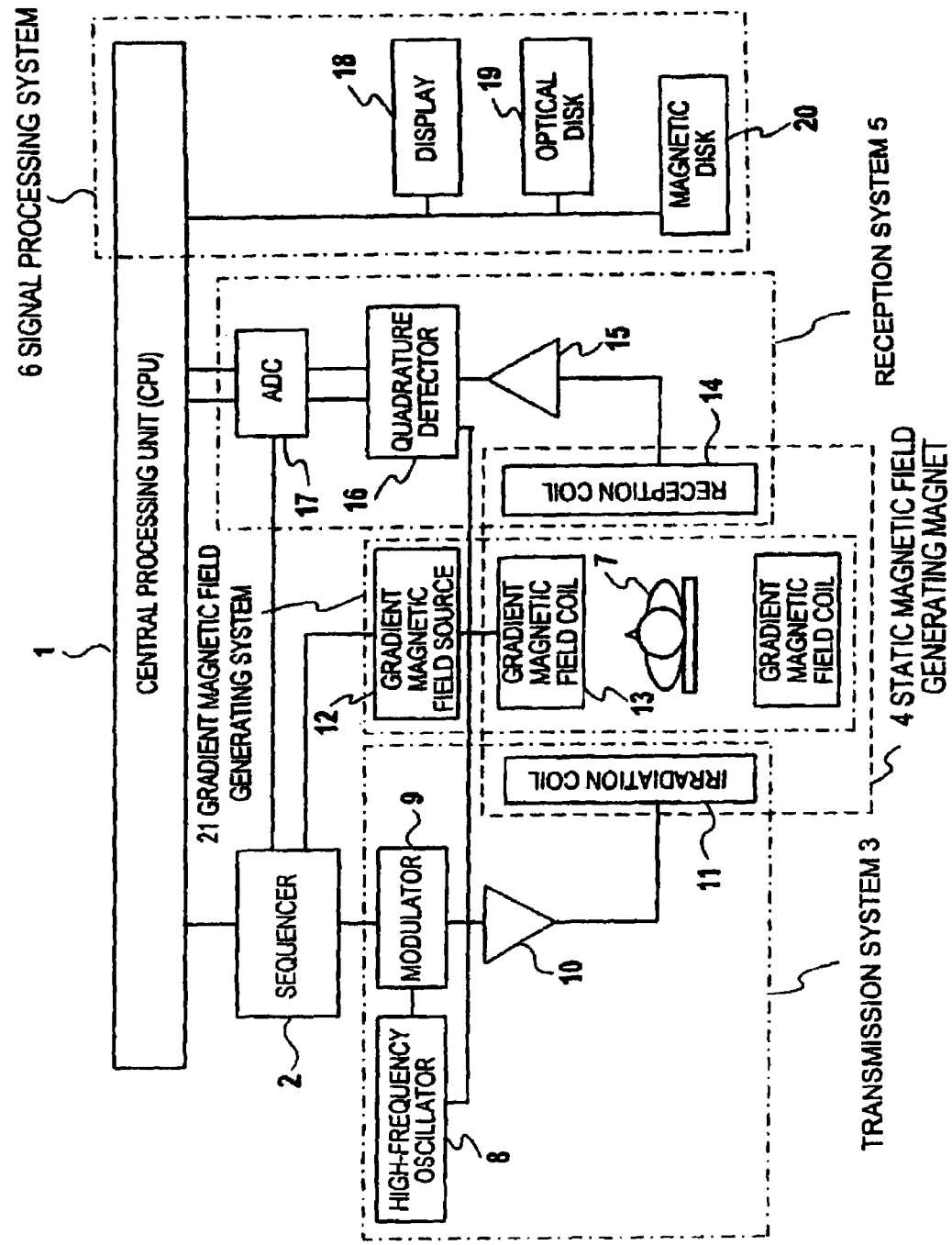
FIG. 1 is a block diagram showing a general configuration of MRI apparatus relating to an embodiment of this disclosure.

Hereinafter, an embodiment of the present invention will be described referring to the diagrams. FIG. 1 is a block diagram showing a general configuration of an MRI apparatus relating to the embodiment of the present invention.

As shown in FIG. 1, MRI is configured and broadly classified by central processing unit (hereinafter referred to as CPU) 1, sequencer 2, transmission system 3, static magnetic field generating magnet 4, reception system 5, gradient magnetic field generating system 21 and signal processing system 6.

CPU 1 controls sequencer 2, transmission system 3, reception system 5 and signal processing system 6 according to the program set in advance. Sequencer 2 operates based on the control commands from CPU 1, and transmits various commands necessary for collecting image data of a tomogram of object 7 to transmission system 3, gradient magnetic field generating system 21 and reception system 5.

Also, transmission system 3 comprises high-frequency oscillator 8, modulator 9 and irradiation coil 11, and irradiates predetermined pulsed electromagnetic waves to object 7 by executing amplitude modulation on the reference high-frequency pulse from high-frequency oscillator 8 using modulator 9 according to the command of sequencer 2, amplifying this high-frequency pulse being executed with amplitude modulation via high-frequency amplifier 10, and providing it to irradiation coil 11. Static magnetic field generating magnet 4 is for generating homogeneous static magnetic field in a space having a predetermined area around, object 7 (hereinafter referred to as imaging space) in a predetermined direction. In this static magnetic field generating magnet 4, irradiation coil 11, gradient magnetic field coil 13 and reception coil 14 are arranged.

Gradient magnetic field coil 13 is included in gradient magnetic field generating system 21, and generates gradient magnetic field in the imaging space under the control of sequencer 2 by receiving the provision of current from gradient magnetic field source 12. Also, receiving system 5 is for detecting the high-frequency signals (NMR signals) being discharged by nuclear magnetic resonance of atomic nuclei of biomedical tissues of object 7, and has reception coil 14, amplifier 15, quadrature detector 16 and A/D converter 17. Additionally high-frequency reply signals (NMR signals) from object 7 by electromagnetic waves being irradiated from the above-mentioned irradiation coil 14 are detected by reception coil 14 arranged in the vicinity of object 7, and inputted to A/D converter 17 via amplifier 15 and quadrature detector 16. Then the signals are converted into digital quantity in A/D converter 17 and transmitted to CPU 1.

Also, signal-processing system 6 comprises an external storage device such as magnetic disk 20 and optical disk 19, and display 18 consists of devices such as CRT.

When data from reception system 5 is inputted to CPU 1, CPU 1 carries out processes such as signal processing and image reconstruction, and displays the desired tomogram of object 7 using display 18 as well as stores those images in external storage devices such as magnetic disk 20.

Next, a schematic cross section of an open MRI apparatus relating to embodiment 1 of the present invention will be described using FIG. 2.

Figure 2:
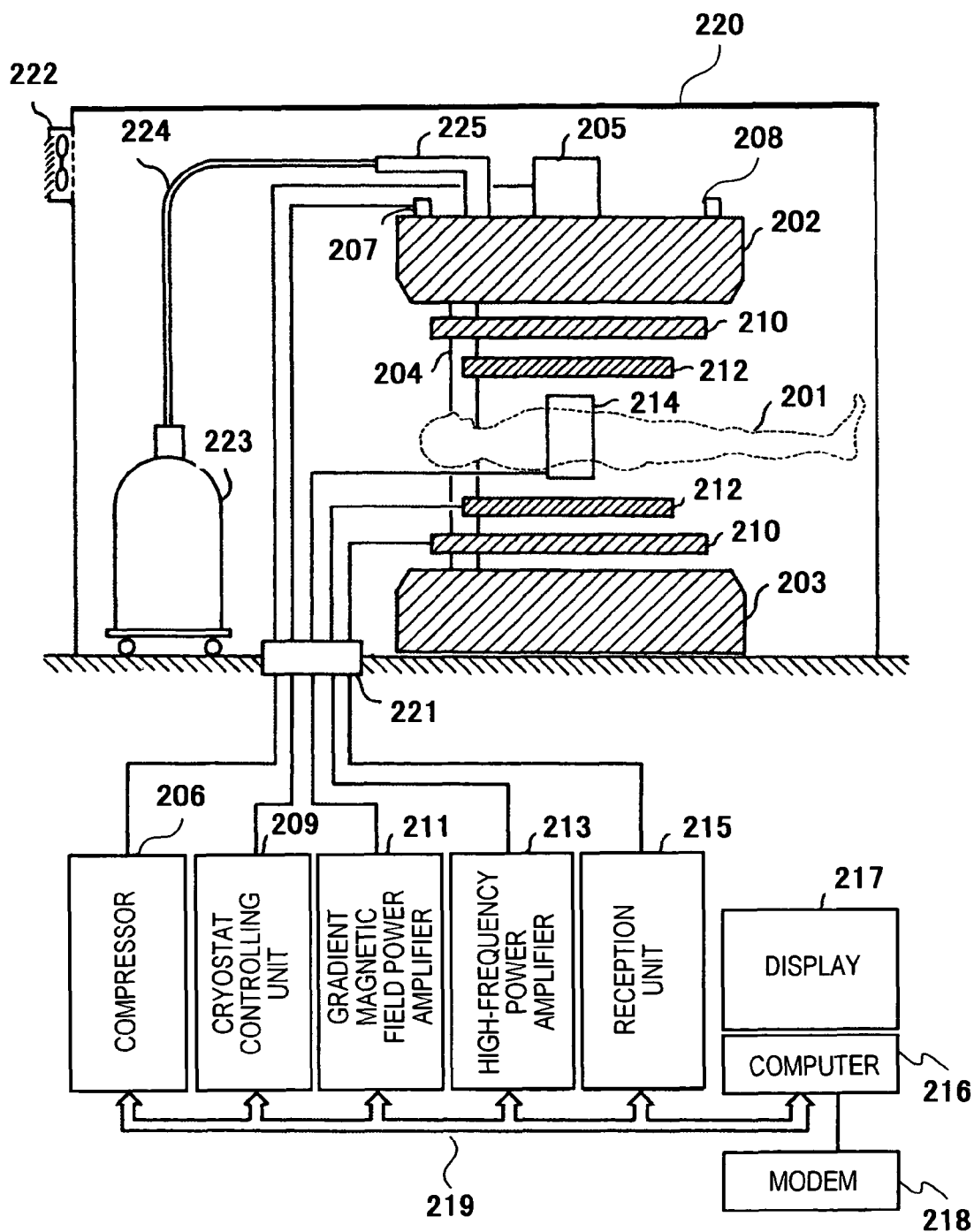
FIG. 2 is a diagram showing a schematic cross-section of an open MRI apparatus relating to embodiment 1.

In FIG. 2, 201 indicates an object to be examined, 202 and 203 indicate upper cryostat and lower cryostat placed over and under, respectively, object 201, with the imaging space being therebetween and having superconducting coils (not shown in the diagram) therein for generating static magnetic field in the imaging space, and 204 indicates a connecting tubule for connecting upper and lower superconducting coils placed inside of the cryostats by connecting the upper and lower cryostats (202 and 203) as well as for causing liquid helium to flow down from the upper cryostat to the lower cryostat.

205 indicates a cryo-cooler attached on top of the upper cryostat and is for condensing the vaporized helium gas to bring it back to liquid helium, 206 is a compressor connected to the cryo-cooler 205 and is for activating the cryo-cooler 205, 207 indicates an output terminal for retrieving signals detected by a liquid helium remaining-quantity sensor and a pressure sensor (not shown in the diagram) placed inside of the liquid helium container (not shown in the diagram), in the upper and lower cryostats, for measuring the remaining quantity or pressure of the liquid helium in the cryostats, and 208 indicates a room pressure sensor placed on top of the upper cryostat and is for detecting the pressure in the shield room which is to be described later.

209 indicates a cryostat control unit connected to output terminal 207 and room pressure sensor 208 and is for implementing control to convert the signals retrieved by output terminal 207 and room pressure sensor 208 into values such as the remaining quantity of the liquid helium or pressure in the liquid helium container or within the shield, or to stop the operation of the cryo-cooler temporarily according to the operational condition of cryo-cooler when the pressure in the liquid helium container is lowered too much. 210 indicates gradient magnetic field coils placed facing each other with imaging space therebetween and is for generating gradient magnetic field in the imaging space, 211 is a gradient magnetic field power amplifier connected to gradient magnetic field coils 210 for passing on electric current to gradient magnetic field coils 210. 212 indicates high-frequency coils arranged facing each other with imaging space therebetween and is for generating approximately homogeneous high-frequency magnetic field to the imaging space, and 213 is a high-frequency power amplifier connected to high-frequency coils 212 and is for passing high-frequency current having the same resonant frequency of the specific atomic nuclei that is structuring object 201 placed in imaging space to high-frequency coils 212.

214 indicates a detection coil placed proximal to object 201 and is for detecting NMR signals generated by nuclei that is structuring object 201, and 215 is a reception unit connected to detection coil 214 and is for amplifying, demodulating the slight NMR signals detected by detection coil 214, converting those signals into digital signals suitable for computer processing and outputting them. 216 is a computer connected to units such as gradient magnetic field power amplifier 211, high-frequency power amplifier 213 and reception unit 215 via bus line to be described later and is for controlling these units to operate in time intervals prescribed by examination sequence, executing a process to convert NMR signals that are converted into digital signals by reception unit 215 into spectrum or images for diagnosis, monitoring the condition in a cryostat on the basis of information relating to the remaining quantity or pressure of liquid helium in the liquid helium container obtained by remaining-quantity sensor and/or pressure sensor of liquid helium and displaying warning messages on display 217 to be described below in case the said information has deviated from the predetermined range. 217 indicates a display connected to computer 216 and is for displaying spectrum or images created by conversion process in computer 216 or for displaying warning messages. 218 is a modem connected to computer 216 and is for forwarding information obtained by the sensors or the warning messages relating to the remaining quantity or pressure of liquid helium to an operator by remote control, and 219 is a bus line for connecting compressor 206, cryostat control unit 208, gradient magnetic field power amplifier 211, high-frequency power amplifier 213 and reception unit 215 to computer 216.

220 indicates a shield room for blocking off the electromagnetic wave noise from outside and setting gantry part of MRI apparatus therein, 221 is a noise filter for preventing noise to enter in to shield room 220 from outside, 222 is ventilating equipment installed on the wall of shield room 220 and is for facilitating an operator to carry out injection of liquid helium safely in shield room 220 which is a closed space, and 223, 224 and 225 respectively indicate helium dewar, transfer tube and transfusion port for injecting liquid helium in the cryostat. Also, though not shown in FIG. 2, computer 216 comprises a console for enabling an operator to input various sorts of information to computer 216.

In an open MRI apparatus shown in FIG. 2, cryostats are arranged in upper and lower sides so that the configuration is widely open in all directions. For example, static magnetic field with 1.0 tesla in strength and less than 2 ppm of homogeneity can be generated in imaging space by superconducting coils placed in upper and lower cryostats 202 and 203.

To compressor 206, other than the function for activating cryo-cooler 205, sensor function for monitoring quantity survey of operating time or operating status of cryo-cooler 205 or the function for outputting the results of the monitoring can also be added.

Gradient magnetic field coils 210 configure a flat structure so that openness of the open MRI apparatus will not be constricted, and X, Y and Z coils (not shown in the diagram) generating gradient magnetic field in 3 directions orthogonal to one another are built up by pairs in the top and bottom of the MRI apparatus. For example, when current is passed through the upper and lower Z-coils, upper Z-coil generates magnetic field so that the magnetic flux with the same direction as the magnetic flux of the superconducting coil is generated, and the lower coil generates the magnetic flux that is 180 degrees reversed direction to the direction of the upper coil. As a result, gradient magnetic field of which the magnetic flux density decreases gradually in the direction from top to bottom of the vertical axis (Z-axis) in imaging space where object 201 is placed is created. In the same manner, X-coil and Y-coil are configured as upper and lower coils so that magnetic flux being generated by superconducting coil can be gradually changed along with X-axis and Y-axis respectively. Gradient magnetic field power amplifier 211 is connected so that current can be passed through the respective gradient magnetic field coils 210 of X, Y and Z. Through generating gradient magnetic field in imaging space by gradient magnetic field coil 210 and gradient magnetic field power amplifier 211, examination target region is specified or positional information is labeled on NMR signals.

High-frequency coils 212 are attached on the far interior side of gradient magnetic field coils 210. These high-frequency coils 212 also use coils of a flat-structure so that openness of the open MRI apparatus will not be constricted. Approximately homogeneous high-frequency magnetic field is created in imaging space where object 201 is laid, by passing high-frequency current coinciding with resonant frequency of a specified nuclei in the object placed in imaging space through a pair of upper and lower high-frequency coils 212 by high-frequency power amplifier 213. For example, hydrogen nucleus included in tissues of target region of object 201 is resonantly excited, by passing high-frequency current of 42 megahertz (resonance frequency of hydrogen nucleus under magnetic field strength of 1 tesla).

Detection coil 214 for detecting NMR signals is placed in the far inner side, that is proximal to object 201. This detection coil 214 detects magnetic conduct of nuclear spin as electrical signals. NMR signals being detected as electrical signals are received by reception unit 215. Reception unit 215 amplifies and detects the received slight NMR signals, converts them into digital signals suitable for computer processing and outputs those signals.

Computer 216 carries out the process to control units such as gradient magnetic field power amplifier 211, execute conversion process on NMR signals being converted to digital signals into spectrum or images to use for diagnosis, store them in memory device (not shown in the diagram) in computer 216 and display them on display 217. Computer 216 further implements a process to control monitoring or recording of operative condition of NMR device on a constant basis or at a regular interval. For example, it measures operative condition or operation time of cryo-cooler 205 or compressor 206, and records it to another region of memory device. In concrete terms, it is set so that information such as remaining quantity or pressure of liquid helium in a liquid helium container is transmitted from cryostat control unit 209 to computer 216, and computer 216 records an absolute value or rate of change of the information and displays it on display 217. Furthermore, room pressure sensor 208 is also connected to cryostat control unit 209 via noise filter 221 by a cable (not shown in the diagram). And it is set so that the value of pressure in the shield room is transmitted from room pressure sensor 208 to computer 216 via cryostat control unit 209, and the value is recorded in computer 216 or displayed on display 217.

Computer 216 is provided with a function, when the recorded data of an absolute value or rate of change of remaining quantity of liquid helium surpasses the upper limit or lower limit, to sound a warning or display a warning on display 217. These monitoring data or warnings can also be transmitted to other places via modem 218 being connected to computer 216.

As for MRI apparatus, as previously mentioned, devices such as cryostats 202 and 203 of which the gantry is constructed are arranged in shield room 220 with the aim of detecting slight NMR signals or blocking off electromagnetic noise that might come in an imaging space from outside. The respective coils 210, 212, 214 and the circuit units such as 211, 213, 215 are connected via noise filter 221. Ventilating equipment 222 is provided so that an operator can carry out the infusion of liquid helium safely in shield room 220 that is a closed space. Furthermore, in FIG. 2, a case of refilling liquid helium by connecting injection port 224 of upper cryostat 202 and helium dewar 223 with transfer tube 225 is illustrated. When cryo-cooler 205 is operating normally there is no need to refill the liquid helium since its cooling capacity surpasses the heat quantity coming in from outside of cryostats 202 and 203, which can improve the efficiency of MRI examination by maintaining the performance of the static magnetic field source with stability.

Figure 3:
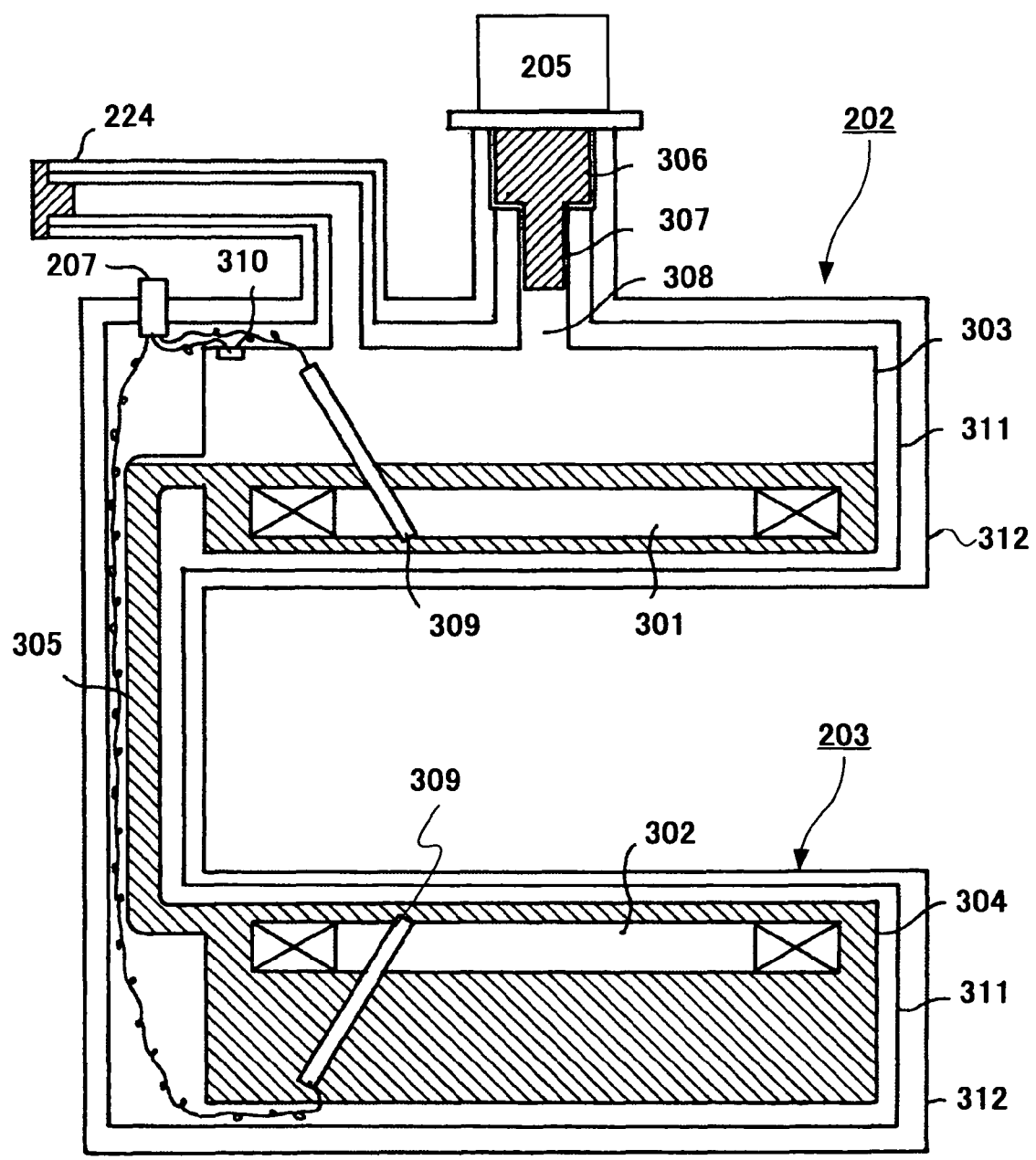
FIG. 3 is a diagram showing cryostats 202 and 203 and cryo-cooler 205 in detail.

Next, cryostats 202 and 203 and cryo-cooler 205 shown in FIG. 2 will be described in detail using FIG. 3. In FIGS. 3, 301 and 302 indicate an upper superconducting coil and a lower superconducting coil for generating static magnetic field, 303 and 304 indicate an upper helium container and a lower helium container for storing liquid helium, 305 is a pipe for connecting the upper helium container and the lower helium container, 306 is the first cooling stage of cryo-cooler 205, 307 is the second cooling stage of cryo-cooler 205, 308 is a pipe for connecting cryo-cooler 205 to upper cryostat 202, 309 is a helium liquid-level sensor for detecting the quantity of liquid helium being stored in upper helium container 303 and lower helium container 305, 310 is a helium container pressure sensor for detecting the pressure in upper helium container 303, 311 is a radiant heat shield for preventing radiant heat coming in from outside, and 312 is a vacuum container being vacuumized inside therein to reduce in-coming of heat. In addition, while a case that the superconducting coils are arranged on top and bottom as a pair is shown in FIG. 3, a plurality of coils can be combined for configuration in order to generate a static magnetic field with high strength and high homogeneity or to reduce leakage of the magnetic field.

Cryo-cooler 205 is set in upper central position of upper cryostat 202. Cryo-cooler 205 of the present embodiment comprises two cooling stages, the first cooling stage 306 has 50 degrees kelvin of cooling performance and the second cooling stage 307 has 4 degrees kelvin in cooling performance. The second cooling stage 307 of cryo-cooler 205 is positioned in pipe 308 being connected to upper helium container 303, and the helium gas being vaporized by this cooling stage is directly cooled in pipe 308 to or below the boiling point. Since the boiling point of helium gas is 4.2 degrees kelvin, helium gas is then liquefied on the surface of the second cooling stage 307 and accumulated in upper helium container 303.

While the configuration for directly cooling helium gas in the second cooling stage is adopted in the present embodiment, helium gas may also be cooled by making second cooling stage 307 to thermally contact the inner side of pipe 308 via heat conducting material such as indium, performing conduction cooling on upper helium container 303 which is connected to pipe 308 to an extent of 4 degrees kelvin, and re-condensing (liquefy) the helium gas in the upper part of upper helium container 303.

In each of upper helium container 303 and lower helium container 304, helium remaining-quantity sensor 309 for detecting the surface level of the liquid helium is embedded. Further, liquid helium container pressure sensor 310 is mounted on the upper part of upper helium container 303. Output power of these sensors are brought together in output terminal 207 and connected to cryostat control unit 209. Radiation heat shield plate 311 is mounted on the outside of upper helium container 303 and lower helium container 304. This radiation heat shield plate 311 thermally contacts the upper part of the first cooling stage 306 of cryo-cooler 205, causing the temperature of the whole shield plate 311 to be 50 degrees kelvin in the first cooling stage 306, and consists of, for example, an all-aluminum plate which is heat conducting and 5 mm in thickness.

On further outside of radiation shield plate 311, vacuum container 312 made of stainless steel of 15 mm in thickness is installed. In the inside of vacuum container 312, the region outside of upper helium container 303, lower helium container 304 and pipe 305, other than parts such as radiation shield plate 311 are vacuumized, which prevents heat from entering in the cryostat along with parts such as radiation shield plate 311.

When parts such as pipe 305 are configured as shown in FIG. 3, by injecting liquid helium in upper helium container 303 and adjust the quantity of liquid helium to the height of more than 50% (normally 80%) of the upper helium container, all of the helium gas being generated in lower helium container 304 will be collected in upper helium container 303 passing through pipe 305, and in reverse liquid helium will be passing through pipe 305 from upper helium container 303 and flow down to refill lower helium container 304. Also, the helium gas being collected in upper part of upper helium container 303 will be re-condensed and accumulated in upper helium container 303.

Figure 4:
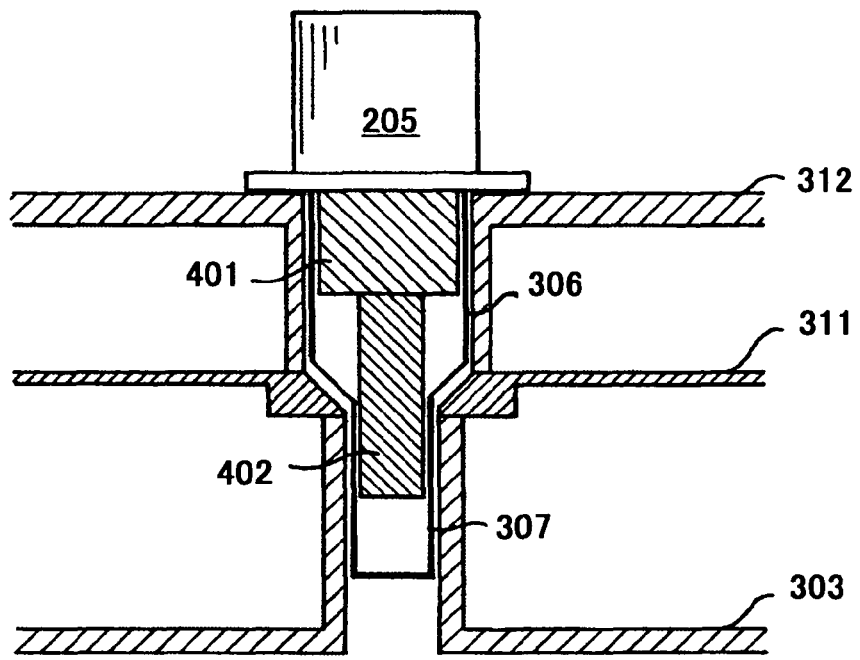
FIG. 4 is an enlarged diagram showing a connecting portion of cryo-cooler 205 to upper cryostat 202.

Next, FIG. 4 is an enlarged diagram of the connecting portion of cryo-cooler 205 to upper cryostat 202 in FIG. 3. In FIG. 4, 401 indicates the first stage displacer for performing piston action vertically in an outer case of the first cooling stage 306, and 402 is the second stage displacer for performing piston action vertically in an outer case of second cooling stage 307. While the principle of operation of the cryo-cooler will be omitted here since it is a well-known art described in documents such as Patent Document 1, the respective displacers 401 and 402 abrade away in the area contacting the outer case from reciprocating motion, and the cooling capability of the cryo-cooler declines. When the cooing capability reaches lower than heat quantity coming in the helium container from outside, the cryo-cooler needs to be replaced with a new one or one with renewed cooling capability.

In the present embodiment, the pressure in the upper helium container is set to be sufficiently higher than the pressure in the shield room upon exchange of cryo-coolers. In concrete terms, an operator issues computer 216 a directive that helium remaining-quantity sensor 309 to consecutively execute the liquid-level measurement of the helium-level. Then an electric current is passed through helium remaining-quantity sensor 309 under control of computer 216, and the liquid helium is vaporized because of the heat developed by the passing of electric current and the helium gas is accumulated in helium container 303. The operator monitors the pressure value in upper helium container 303 and the pressure value in the shield room on display 217, and exchanges cryo-cooler 205 when it is confirmed that the pressure value in upper helium container 303 is sufficiently higher (for example, by the extent of 2~4 psi (pounds per square inch)) than the pressure value in the shield room. The operation of helium liquid-level sensor 309 is described in detail in JP-A-2002-336216 (U.S. Pat. No. 6,748,749).

Figure 5:
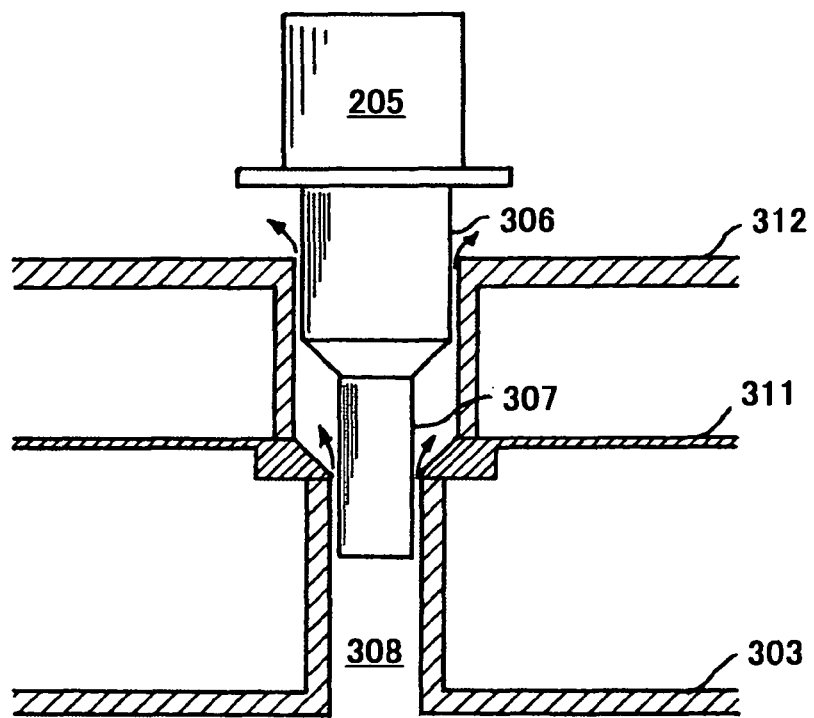
FIG. 5 is a diagram showing a state of helium gas belching out.

In the present embodiment, when an operator attempts to remove cryo-cooler 205 for replacement, helium gas starts to belching out of the gap between pipe 308 and the outer case of the second cooling stage 307 and also the outer case of the first cooling stage 306 as shown in FIG. 5, and helium gas belches out of pipe 308 when cryo-cooler is taken out. The operator interposes new cryo-cooler 205 into pipe 308 while helium gas is belching out. Alternatively, the operator mounts new cryo-cooler 205 after covering the upper part of pipe 308 first with a plate made of aluminum or acrylate resin and confirming that the pressure in the upper helium container is sufficiently higher again than the pressure in the shield room. When new cryo-cooler 205 is finished being mounted, the operator inputs a command to computer 216 to end the helium liquid-level measurement by liquid helium remaining-quantity sensor 309. Then helium remaining-quantity sensor 309 stops the measurement of the liquid helium remaining-quantity under control of computer 216.

In the replacement procedure of the present embodiment, surrounding atmosphere does not flow into the helium container through pipe 308 and it prevents problems such as the air improperly flowing in, being solidified and clogging the vicinity of the entrance.

Figure 6:
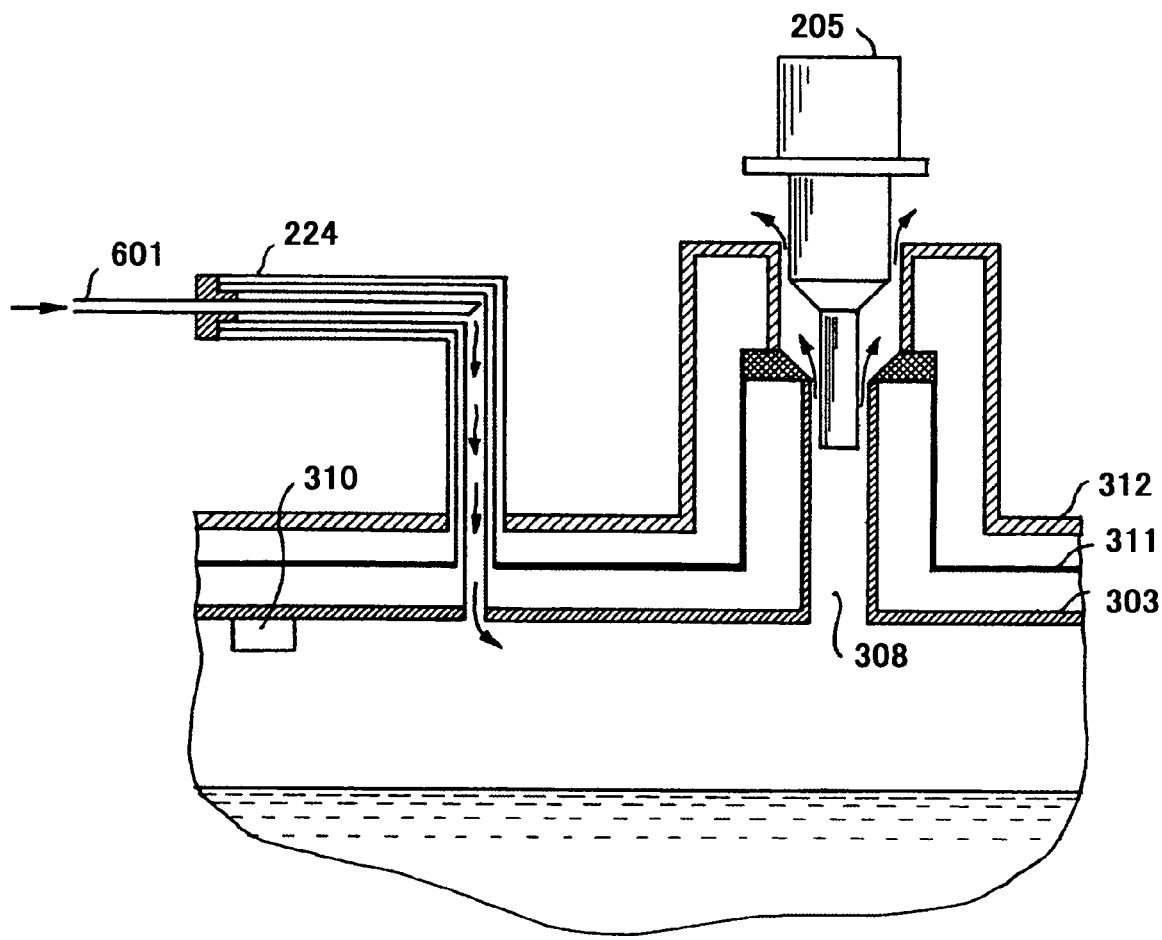
FIG. 6 is a diagram showing a part of an open MRI apparatus relating to embodiment 2.

Next, embodiment 2 of the present invention will be described referring to FIG. 6. In embodiment 2, as shown in FIG. 6, gas pipe 601 is inserted to injection port 224 of liquid helium, and high-pressure helium gas is injected into the helium container from there. Through this operation, helium gas permeates the upper helium container 303 and the replacement of cryo-cooler 205 can be carried out in such a condition in the same manner as embodiment 1. Upon injecting helium gas into the upper helium container, the operator should replace cryo-cooler 205 after monitoring the pressure value in upper helium container 303 and the pressure value in the shield room on display 217 and confirming that the pressure in upper helium container 303 is sufficiently higher than the pressure in the shield room.

In the present embodiment, when an operator attempts to remove cryo-cooler 205 for replacement, helium gas starts to belching out of the gap between pipe 308 and the outer case of the second cooling stage 307 and also from a gap of pipe 308 and the outer case of the first cooping stage 306 as shown in FIG. 5, and helium gas belches out of pipe 308 when cryo-cooler 205 is taken out. The operator interposes new cryo-cooler 205 into pipe 308 while helium gas is belching out. Alternatively, the operator mounts new cryo-cooler 205 after covering the upper part of pipe 308 first with a plate made of aluminum or acrylate resin, and confirming that the pressure in the upper helium container is sufficiently higher again than the pressure in the shield room.

In the replacement procedure of the present embodiment, as is described in embodiment 1, surrounding atmosphere does not flow into the helium container through pipe 308 and it prevents problems such as the air improperly flowing in, being solidified and clogging the vicinity of the entrance.

The method of the present embodiment is effective in raising the pressure of upper helium container 303 in a short period of time, as well as having the advantage of being able to refill helium gas at the same time of replacing the cryo-cooler.

Next, embodiment 3 of the present invention will be described.

Embodiment 3 of the present invention is a method for raising the pressure in upper cryostat 303 by stopping a part or the entire operation of cryo-cooler 205 from about a day before the replacement of cryo-cooler 205 and increasing the amount of evaporation of the liquid helium in the cryostat. When a part or the entire operation of cryo-cooler 205 is stopped and cooling performance of cryo-cooler 205 has decreased, temperature of radiation heat shield plate 311 is raised and balance of thermal stability between heat coming from outside and the cooling capability of cryo-cooler 205 is disrupted. As a result, the amount of evaporation of liquid helium in the liquid helium container is increased and pressure in upper helium container 303 is also increased. Therefore, the operator needs to replace cryo-cooler 205 after monitoring the pressure value in upper helium container 303 and the pressure value in the shield room on display 217 and confirming that the pressure in upper helium container 303 is sufficiently higher than the pressure in the shield room.

In the present embodiment, when an operator attempts to remove cryo-cooler 205 for replacement, helium gas starts to belching out of the gap between pipe 308 and the outer case of the second cooling stage 307 and also between the outer case of the first cooling stage 306 as shown in FIG. 5, and the operator can interposes new cryo-cooler 205 into pipe 308 while helium gas is belching out. Alternatively, the operator replaces cryo-cooler 205 after first covering the upper part of pipe 308 with a plate made of aluminum or acrylate resin, monitoring again the pressure value in upper helium container 303 on display 217, on the other hand monitoring on display 217 the pressure value in the shield room, and confirming on display 217 that the pressure in the upper helium container 303 is sufficiently higher again than the pressure in the shield room.

In the replacement procedure of the present embodiment, as is described in embodiment 1 or embodiment 2, surrounding atmosphere does not flow into the helium container through pipe 308 and it prevents problems such as air improperly flowing in, being solidified and clogging the vicinity of the entrance.

Next, embodiment 4 of the present invention will be described.

Embodiment 4 of the present invention is a method for decreasing the pressure in shield room 220 by operating ventilating equipment 222 in shield room 220 at the time of replacing cryo-cooler 205. First, pressure in shield room 220 is decreased in such manner, then cryo-cooler 205 is replaced after monitoring pressure value in upper helium container 303 and pressure value in the shield room on display 217 and confirming that the pressure in upper helium container 303 is sufficiently higher than the pressure in the shield room.

In the present embodiment, when an operator attempts to remove cryo-cooler 205 for replacement, helium gas starts to belching out of the gap between pipe 308 and the outer case of the second cooling stage 307 and also between the outer case of the first cooping stage 306 as shown in FIG. 5. The operator interposes new cryo-cooler 205 into pipe 308 while helium gas is belching out. Alternatively, the operator mounts new cryo-cooler 205 after covering the upper part of pipe 308 once with a plate made of aluminum or acrylate resin, monitoring the pressure value again in upper helium container 303 on display 217, on the other hand monitoring the pressure value in the shield room on display 217, and confirming that the pressure in the upper helium container 303 is sufficiently higher again than the pressure in the shield room. The placement of new cryo-cooler 205 is carried out after confirming the pressure value in the cryostat. In the replacement procedure of the present embodiment, as is described in embodiment 1~3, surrounding atmosphere does not flow into the helium container through pipe 308 and it prevents problems such as the air improperly flowing in, being solidified and clogging the vicinity of the entrance. In this regard, however that ventilation equipment 222 is preferred to be a pressure ventilator in this embodiment to make pressure difference between inside and outside of the shield room.

The present invention is not limited to the above-mentioned embodiments, and various changes may be made without departing from the scope of the present invention. For example, the present invention can be applied not only to an open MRI apparatus but also to cylindrical-formed horizontal magnetic field system MRI apparatus. Also in embodiment 1, helium remaining-quantity sensor 309 does not have to be used in order to generate helium gas, and generation of helium gas may be carried out through arranging a special heater in the liquid helium container and turning on and off an electric current under the command of the operator and the control of the computer. Moreover, it may be set so that the difference between pressure value in upper helium container 303 and pressure value in the shield room is calculated by computer 216 and displayed on display 217. Ending the helium remaining-quantity examination or passing an electric current on the heater may be carried out after replacing the cryo-cooler, even earlier than the time of replacement if it is sufficient to generate helium gas.

The invention claimed is:

1. A method of replacing a cryo-cooler in a magnetic resonance imaging apparatus comprising: a vacuum container vacuumized inside thereof; a liquid refrigerant container installed in the vacuum container to store liquid refrigerant therein; a superconducting member installed inside the liquid refrigerant container to be rendered superconductive by being impregnated in the liquid refrigerant and allow current to flow therethrough; and the cryo-cooler connected to an insertion port provided in the liquid refrigerant container to re-condense gas evaporated from the liquid refrigerant in the liquid refrigerant container, wherein the method comprises:
(a) a step of increasing an internal pressure in the liquid refrigerant container to an internal pressure level that is higher than a level of pressure outside of the vacuum container, to prevent air from flowing into the liquid refrigerant container from the outside of the vacuum container via the insertion port; and
(b) a step of monitoring the internal pressure in the liquid refrigerant container and replacing the cryo-cooler in the magnetic resonance imaging apparatus when it is confirmed that the internal pressure in the liquid refrigerant container is higher than the pressure outside of the vacuum container, while the air is being prevented in (a) from flowing into the liquid refrigerant container from outside of the vacuum container via the insertion port by belching out gas evaporated from the liquid refrigerant in the liquid refrigerant container via the insertion port, and thus preventing the insertion port from being blocked by constituents of the air that solidify and attach near an entrance of the insertion port of the liquid refrigerant container.

2. The method according to claim 1, wherein the refrigerant container is provided with a hole, including:
(1) a step for raising pressure in the refrigerant container by injecting helium gas into the refrigerant container from outside of the container;
(2) a step for replacing the freezing means after raising pressure in the liquid refrigerant container; and
(3) a step for ending the injection of helium gas into the refrigerant container from outside of the container after replacing the freezing means.

3. The method according to claim 1, wherein the cryo-cooler in the magnetic resonance imaging apparatus is replaced in (b) when it is confirmed that the internal pressure in the liquid refrigerant container is 2 to 4 psi (pounds per square inch) higher than the pressure outside of the vacuum container.

4. A method for replacing a cryo-cooler in a magnetic resonance imaging apparatus comprising a vacuum container vacuumized inside thereof, a liquid refrigerant container installed in the vacuum container to store liquid refrigerant therein, a superconducting member installed inside the liquid refrigerant container to be rendered superconductive by being impregnated in the liquid refrigerant and allow current to flow therethrough, the cryo-cooler connected to an insertion port provided in the liquid refrigerant container to re-condense gas evaporated from the liquid refrigerant in the liquid refrigerant container, and a heater in the refrigerant container, wherein the method includes:
a step of increasing an internal pressure in the liquid refrigerant container to an internal pressure level that is higher than a level of pressure outside of the vacuum container, by passing electric current through the heater, under control of a control unit of the magnetic resonance imaging apparatus, to generate heat from the heater that causes the liquid refrigerant in the liquid refrigerant container to evaporate through the generated heat;
a step of monitoring the internal pressure in the liquid refrigerant container;
a step of replacing the cryo-cooler in the magnetic resonance imaging apparatus when it is confirmed that the internal pressure in the liquid refrigerant container is higher than the pressure outside of the vacuum container, while the internal pressure in the liquid refrigerant container is higher than the level of pressure outside of the vacuum container, and thus preventing the insertion port from being blocked by constituents of the air that solidify and attach near an entrance of the insertion port of the liquid refrigerant container by belching out gas evaporated from the liquid refrigerant in the liquid refrigerant container via the insertion port; and
a step of ending the passing of electric current through the heater after replacing the cryo-cooler.

5. The method according to claim 4, wherein the cryo-cooler in the magnetic resonance imaging apparatus is replaced when it is confirmed that the internal pressure in the liquid refrigerant container is 2 to 4 psi (pounds per square inch) higher than the pressure outside of the vacuum container.

6. A method for replacing a cryo-cooler in a magnetic resonance imaging apparatus comprising a vacuum container vacuumized inside thereof, a liquid refrigerant container installed in the vacuum container to store liquid refrigerant therein, a superconducting member installed inside the liquid refrigerant container to be rendered superconductive by being impregnated in the liquid refrigerant and allow current to flow therethrough, a cryo-cooler connected to an insertion port provided in the liquid refrigerant container to re-condense gas evaporated from the liquid refrigerant in the liquid refrigerant container, and a liquid-amount measurement sensor in the refrigerant container for measuring amount of the liquid refrigerant in the refrigerant container, wherein the maintenance method includes:
a step of passing electric current through the liquid-amount measurement sensor, under control of a control unit of the magnetic resonance imaging apparatus, to generate heat and thereby increasing an internal pressure in the liquid refrigerant container to an internal pressure level that is higher than a level of pressure outside of the vacuum container, by evaporating the liquid refrigerant through the generation of heat;
a step of monitoring the internal pressure in the liquid refrigerant container;
a step of replacing the cryo-cooler in the magnetic resonance imaging apparatus when it is confirmed that the internal pressure in the liquid refrigerant container is higher than the pressure outside of the vacuum container, while the internal pressure in the liquid refrigerant container is higher than a level of pressure outside of the vacuum container, and thus preventing the insertion port from being blocked by constituents of the air that solidify and attach near an entrance of the insertion port of the liquid refrigerant container by belching out gas evaporated from the liquid refrigerant in the liquid refrigerant container via the insertion port; and
a step of ending the passing of electric current through the liquid-amount measurement sensor after replacing the cryo-cooler freezing means.

7. The method according to claim 6, wherein the cryocooler in the magnetic resonance imaging apparatus is replaced when it is confirmed that the internal pressure in the liquid refrigerant container is 2 to 4 psi (pounds per square inch) higher than the pressure outside of the vacuum container.

* * * * *

UNITED STATES PATENT AND TRADEMARK OFFICE
CERTIFICATE OF CORRECTION

| | |
|---|---|
| PATENT NO. | : 8,893,516 B2 |
| APPLICATION NO. | : 11/630220 |
| DATED | : November 25, 2014 |
| INVENTOR(S) | : Tsuda |

It is certified that error appears in the above-identified patent and that said Letters Patent is hereby corrected as shown below:

On the title page item [30], should read:

Jul. 2, 2004   (JP) ………………………. 2004-196385

Signed and Sealed this
Seventeenth Day of March, 2015

Michelle K. Lee
*Director of the United States Patent and Trademark Office*